United States Patent
Guo

(10) Patent No.: US 11,711,153 B2
(45) Date of Patent: Jul. 25, 2023

(54) WIRELESS SIGNAL PERFORMANCE ADJUSTMENT APPARATUS AND METHOD AND WIRELESS COMMUNICATION TERMINAL

(71) Applicant: ZTE CORPORATION, Guangdong (CN)

(72) Inventor: Shuai Guo, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 17/613,049

(22) PCT Filed: Jun. 3, 2020

(86) PCT No.: PCT/CN2020/094086
§ 371 (c)(1),
(2) Date: Nov. 20, 2021

(87) PCT Pub. No.: WO2021/004199
PCT Pub. Date: Jan. 14, 2021

(65) Prior Publication Data
US 2022/0255640 A1   Aug. 11, 2022

(30) Foreign Application Priority Data
Jul. 8, 2019  (CN) .......................... 201910609100.7

(51) Int. Cl.
*H04B 17/12* (2015.01)
*H04B 17/10* (2015.01)
(Continued)

(52) U.S. Cl.
CPC ........... *H04B 17/12* (2015.01); *H04B 17/103* (2015.01); *H04B 17/104* (2015.01); *H04B 17/18* (2015.01); *H04L 27/2614* (2013.01)

(58) Field of Classification Search
CPC ...... H04B 17/12; H04B 17/18; H04B 17/103; H04B 17/104; H04L 27/2614
See application file for complete search history.

(56) References Cited

U.S. PATENT DOCUMENTS 7,085,330 B1 *  8/2006  Shirali ...................... H03F 3/24
                                                                375/296
7,907,678 B2 *  3/2011  Mizuta .................. H03F 1/3258
                                                                375/295
(Continued)

FOREIGN PATENT DOCUMENTS

CN       101252752 A      8/2008
CN       104243721 A     12/2014
(Continued)

OTHER PUBLICATIONS

ZTE Corporation, Extended European Search Report, EP 20837265.6, dated May 30, 2022, 8pgs.
(Continued)

*Primary Examiner* — Junpeng Chen

(57) ABSTRACT

Disclosed are a wireless signal performance adjustment apparatus and method, and a wireless communication terminal. The wireless signal performance adjustment apparatus comprises a monitoring unit, a control unit, a measurement unit and an adjustment unit. The monitoring unit is configured to monitor a radio frequency signal of a transmitting channel; the control unit is configured to receive the radio frequency signal from the transmitting channel, control the measurement unit to perform measurement if the radio frequency signal does not meet a performance requirement condition, and determine adjustment information according to load impedance of a power amplifier in the transmitting channel; the measurement unit is configured to measure the load impedance under the control of the control unit; and the adjustment unit is configured to adjust the
(Continued)

transmitting channel according to the adjustment information under the control of the control unit, so that the radio frequency signal meets the performance requirement condition.

17 Claims, 5 Drawing Sheets

(51) Int. Cl.
    *H04B 17/18*     (2015.01)
    *H04L 27/26*     (2006.01)

(56) References Cited

U.S. PATENT DOCUMENTS

| | | | | |
|---|---|---|---|---|
| 2004/0116083 | A1* | 6/2004 | Suzuki | H03F 1/3258 |
| | | | | 330/149 |
| 2009/0140806 | A1* | 6/2009 | Shako | H03F 1/3282 |
| | | | | 330/149 |
| 2010/0039100 | A1* | 2/2010 | Sun | H04B 1/0475 |
| | | | | 324/123 R |
| 2010/0261442 | A1* | 10/2010 | Paculdo | H04B 1/0458 |
| | | | | 455/110 |
| 2012/0105147 | A1 | 5/2012 | Harris et al. | |
| 2013/0027129 | A1 | 1/2013 | Langer | |
| 2014/0323065 | A1 | 10/2014 | Lei | |
| 2015/0236655 | A1* | 8/2015 | Hirose | H03F 1/3241 |
| | | | | 330/297 |
| 2019/0334565 | A1* | 10/2019 | Itkin | H04B 17/12 |

FOREIGN PATENT DOCUMENTS

| | | |
|---|---|---|
| CN | 102420353 B | 8/2015 |
| CN | 105406902 A | 3/2016 |
| CN | 105472082 A | 4/2016 |
| CN | 105939417 A | 9/2016 |
| CN | 106464392 A | 2/2017 |
| CN | 108183694 A | 6/2018 |
| CN | 207977584 U | 10/2018 |
| CN | 108900206 A | 11/2018 |

OTHER PUBLICATIONS

ZTE Corporation, CN First Office Action with English Translation, CN 201910609100.7, dated Dec. 20, 2021, 18 pgs.

ZTE Corporation, International Search Report, PCT/CN2020/094086, dated Sep. 4, 2020, 5 pgs.

* cited by examiner

WIRELESS SIGNAL PERFORMANCE ADJUSTMENT APPARATUS AND METHOD AND WIRELESS COMMUNICATION TERMINAL

The present application is a United States National Stage Application filed under 35 U.S.C. § 371 of PCT Patent Application No. PCT/CN2020/094086, filed Jun. 3, 2020, which claims priority to Chinese patent application No. 201910609100.7, filed before China National Intellectual Property Administration on Jul. 8, 2019, each of which is incorporated by reference herein in its entirety.

TECHNICAL FIELD

The present disclosure relates to electromagnetic compatibility technology, for example, to a wireless signal performance adjustment apparatus and method and a wireless communication terminal.

BACKGROUND

For electronic products, many countries and related standards organizations have formulated a series of electromagnetic compatibility requirements. In order to meet these test specifications, electromagnetic compatibility performance of mobile terminals such as mobile phones shall be highly considered during design and production.

In a test specification for electromagnetic compatibility performance, the operation state of wireless communication terminals, such as mobile phones, is clearly specified, and during the test, it is also necessary to strictly follow the corresponding specifications to ensure that the electromagnetic compatibility test meets the standard. However, in the actual operation state, the application scenarios of the wireless communication terminals will exceed those in the test specifications. That is to say, wireless communication terminals tested as meeting the electromagnetic compatibility performance standards according to the test specifications may not achieve better electromagnetic compatibility performance in actual use scenarios that are complex and changeable.

SUMMARY

The present disclosure provides a wireless signal performance adjustment apparatus and method and a wireless communication terminal, which can meet an electromagnetic compatibility performance requirement in a complex and changeable actual use scenario.

Some embodiments of the present disclosure provide a wireless signal performance adjustment apparatus, which includes a monitoring unit, a control unit, a measurement unit and an adjustment unit.

The monitoring unit is configured to monitor a radio frequency signal of a transmitting channel.

The control unit is configured to receive the radio frequency signal of the transmitting channel from the monitoring unit, control the measurement unit to perform measurement if the radio frequency signal of the transmitting channel does not meet a performance requirement condition, and determine adjustment information according to a load impedance from the measurement unit.

The measurement unit is configured to measure a load impedance of a power amplifier in the transmitting channel under the control of the control unit.

The adjustment unit is configured to adjust the transmitting channel according to the adjustment information under the control of the control unit, so that the radio frequency signal of the transmitting channel meets the performance requirement condition.

Some embodiments of the present disclosure further provide a wireless communication terminal, which includes the wireless signal performance adjustment apparatus described in any embodiment of the present disclosure.

Some embodiments of the present disclosure further provide a wireless signal performance adjustment method.

The method includes obtaining a radio frequency signal of a transmitting channel of a wireless communication terminal.

The method includes measuring a load impedance of a power amplifier in the transmitting channel when determining, according to the obtained radio frequency signal of the transmitting channel, that the radio frequency signal of the transmitting channel does not meet a performance requirement condition.

The method includes adjusting the transmitting channel according to the load impedance obtained by the measurement so that the radio frequency signal of the transmitting channel meets the performance requirement condition.

DETAILED DESCRIPTION

Figure 1:
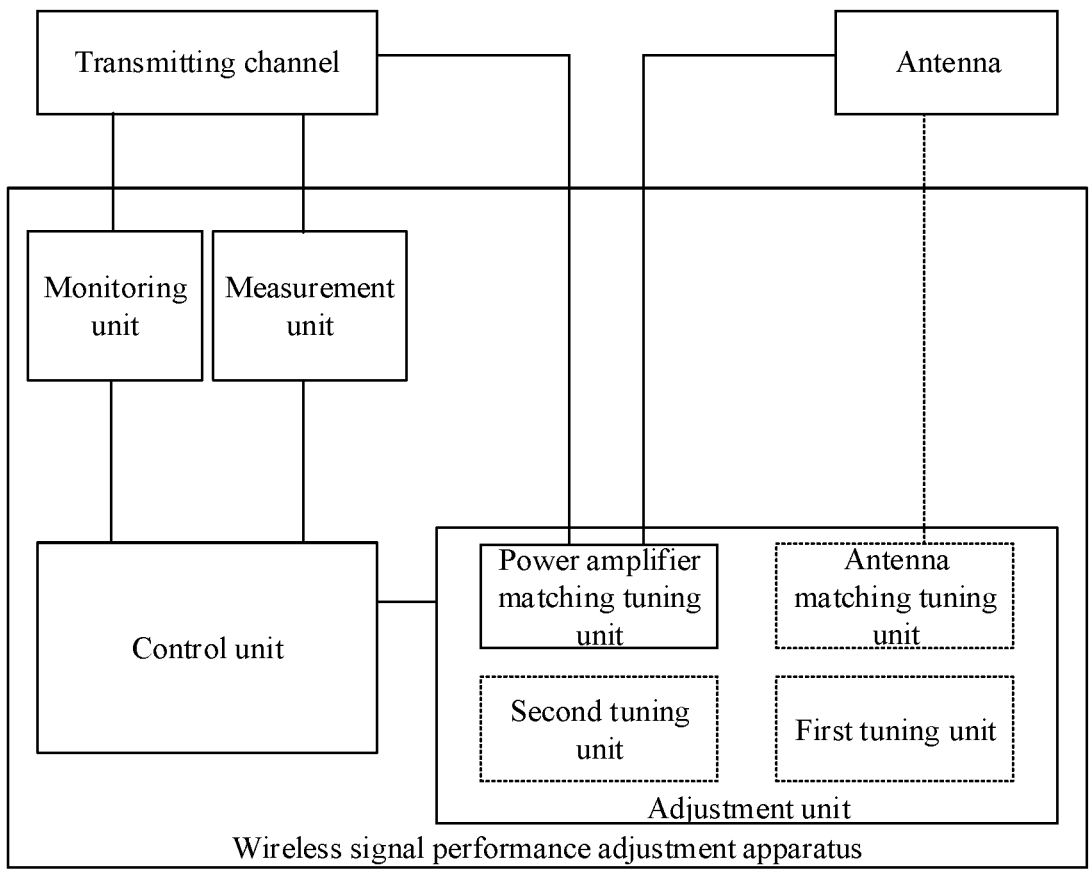
FIG. 1 is a schematic diagram illustrating a composition and structure of a wireless signal performance adjustment apparatus according to an embodiment of the present disclosure.

In a configuration of an embodiment, a computing device includes one or more central processing units (CPU), input/output interfaces, network interfaces, and memories.

The memories may include a non-permanent memory, a random access memory (RAM), and/or a non-volatile memory in the computer-readable medium, such as a read-only memory (ROM) or a flash RAM. The internal storage is an example of the computer-readable medium.

The computer-readable medium, including permanent computer-readable medium and non-permanent computer-readable medium, removable and non-removable media, may implement information storage by any method or technology. The information may be a computer-readable instruction, a data structure, a module of program, or other data. Examples of the computer storage medium include, but not limited to, a phase-change random access memory (PRAM), a static random access memory (SRAM), a dynamic random access memory (DRAM), other types of random access memory (RAM), the read-only memory (ROM), an electrically erasable programmable read-only memory (EEPROM), a flash memory or other memory technologies, a compact disc read-only memory (CD-ROM), a digital video disk (DVD) or other optical storage, a magnetic cassette, a magnetic tape magnetic disk storage or other magnetic storage devices or any other non-transmission medium, which may be used to store the information accessible by the computing device. As defined herein, the computer-readable medium does not include a non-temporary computer-readable medium (transitory media) such as a modulated data signal and a carrier wave.

Embodiments of the present disclosure will be described below with reference to the accompanying drawings.

Taking a frequency-division duplexing (FDD) mode in wireless communication as an example, a transmitting frequency and a receiving frequency are different, and a power amplifier of a transmitting channel may not only generate a signal in a transmitting frequency band, but also generate an interference signal within a receiving frequency band. As for a received signal, these interference signals within the receiving frequency band are noises, which are generally called a receive band noise (RxBN), thus the smaller the RxBN is, the better it is. Further, in addition to amplifying useful signals in the transmitting frequency band, the power amplifier on the transmitting channel may also generate harmonic signals, which needs to be strictly limited. There are strict requirements for intensity of a harmonic in a variety of electromagnetic compatibility (EMC) test specifications. Both the RxBN and the harmonic come from the power amplifier, and these two indexes are closely related to a load impedance of the power amplifier. Different load impedances correspond to different RxBN and harmonic characteristics. Therefore, the power amplifier may usually have specific loadpull information (also called loadpull diagram). In related technologies, in the development and debugging stage of a wireless communication terminal, such as a mobile phone, a specific radio frequency impedance position may be selected according to the loadpull, but only if a position of a radio frequency test socket is connected with a radio frequency instrument having a load impedance of 50Ω. However, when a mobile terminal is actually used, an impedance of the position of the radio frequency test socket may change in real time with an application scenario, that is, the load impedance of the power amplifier may also change accordingly, which may cause deterioration of the RxBN and the harmonic.

Since the impedance of the antenna may change with the application scenario, the output performance of the power amplifier may change, which causes the electromagnetic compatibility performance of the mobile terminal to deteriorate easily. Therefore, the present disclosure proposes to notice an abnormal state by monitoring a transmission indicator of the transmitting channel in real time, and adjust the transmission performance of the transmitting channel by adjusting the power amplifier, such as adjusting a transmitting power of the power amplifier, adjusting a matching of the power amplifier, or reducing a peak-to-average ratio of a transmitted signal, or adjusting a matching of the antenna, so as to reduce an electromagnetic interference signal radiated by the wireless communication terminal, thereby improving the electromagnetic compatibility performance of the wireless communication terminal, and thus meeting the electromagnetic compatibility performance requirement of the wireless communication terminal in a complex and changeable actual use scenario.

FIG. 1 is a schematic diagram illustrating a composition and structure of a wireless signal performance adjustment apparatus provided by an embodiment of the present disclosure. As shown in FIG. 1, the wireless signal performance adjustment apparatus at least includes: a monitoring unit, a control unit, a measurement unit and an adjustment unit; where the monitoring unit is configured to monitor a radio frequency signal of a transmitting channel; the control unit is configured to receive the radio frequency signal of the transmitting channel from the monitoring unit, control the measurement unit to perform measurement if the radio frequency signal of the transmitting channel does not meet a performance requirement condition, and determine adjustment information according to a load impedance from the measurement unit; the measurement unit is configured to measure a load impedance of a power amplifier in the transmitting channel under the control of the control unit; and the adjustment unit is configured to adjust the transmitting channel according to the adjustment information under the control of the control unit, so that the radio frequency signal of the transmitting channel meets the performance requirement condition.

In an exemplary example, the monitoring unit may monitor a transmitting channel of a wireless communication terminal in real time to obtain the radio frequency signal of the transmitting channel. The radio frequency signal of the transmitting channel may also be obtained by monitoring the transmitting channel of the wireless communication terminal according to a preset period or within a specified time period.

In an exemplary example, the adjustment unit includes at least one of the following modules: a power amplifier matching and tuning module configured to adjust matching of the power amplifier in the transmitting channel, so that the radio frequency signal of the transmitting channel meets the performance requirement condition; an antenna matching and tuning module configured to adjust an impedance matching between the transmitting channel and an antenna, so that the radio frequency signal of the transmitting channel meets the performance requirement condition; a first tuning module configured to adjust a peak-to-average ratio of a transmitted signal in the transmitting channel, so that the radio frequency signal of the transmitting channel meets the performance requirement condition; and a second tuning module configured to adjust a transmitting power so that the radio frequency signal of the transmitting channel meets the performance requirement condition.

In an exemplary example, the adjustment unit includes the power amplifier matching tuning module; or, the adjustment unit includes the power amplifier matching tuning module and the antenna matching tuning module; or, the adjustment unit includes the power amplifier matching tuning module, the antenna matching tuning module and the first tuning module; or, the adjustment unit includes the power amplifier matching tuning module, the antenna matching tuning module, the first tuning module and the second tuning module.

In an exemplary example, not meeting the performance requirement condition includes not meeting an electromagnetic compatibility performance requirement.

The present disclosure detects an abnormal state by monitoring a transmission indicator of the transmitting channel in real time, and realizes adjustment of the transmission performance of the transmitting channel by adjusting the power amplifier, so as to reduce electromagnetic interference signals radiated by the wireless communication terminal, thereby improving the electromagnetic compatibility performance of the wireless communication terminal, such that the wireless communication terminal in a complex and changeable actual use scenario meets the electromagnetic compatibility performance requirement.

Figure 2:
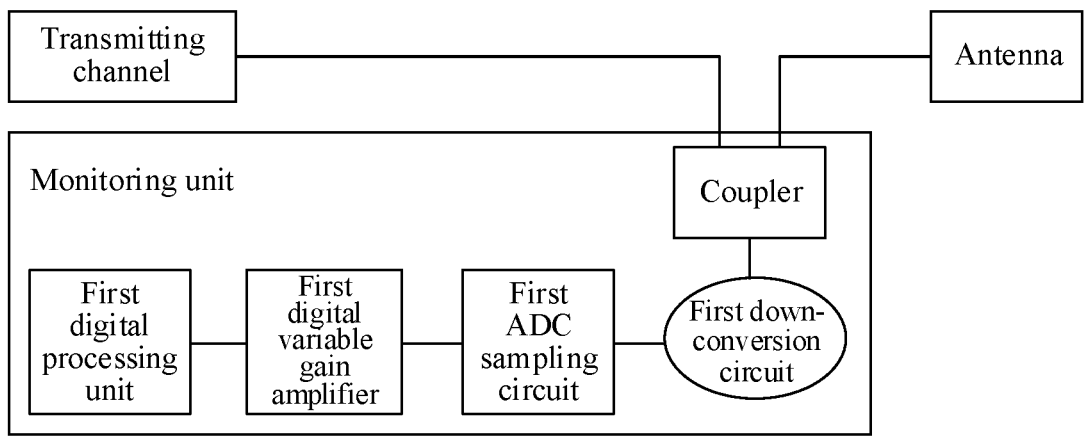
FIG. 2 is a schematic diagram illustrating a composition and structure of a monitoring unit according to an embodiment of the present disclosure.

FIG. 2 is a schematic diagram illustrating a composition and structure of a monitoring unit according to an embodiment of the present disclosure. As shown in FIG. 2, the monitoring unit at least includes a coupler, a first down-conversion circuit, a first analog-to-digital converter (ADC) sampling circuit, a first digital variable gain amplifier and a first digital processing unit; where the coupler is configured to obtain the radio frequency signal by coupling from the transmitting channel and output the radio frequency signal to the first down-conversion circuit; the first down-conversion circuit is configured to process the radio frequency signal obtained by coupling according to a preset frequency so as to obtain a low-frequency signal at a required frequency point; the first ADC sampling circuit is configured to perform analog-to-digital conversion on the low-frequency signal to obtain a digital signal; and the first digital variable gain amplifier is configured to amplify the digital signal obtained by the analog-to-digital conversion so that the amplified digital signal is in a range that the first digital processing unit may process. In this way, a signal amplitude sampled by the ADC will not be too large or too small, and the first digital processing unit is ensured to realize an accurate amplitude judgment. The first digital processing unit is configured to calculate an amplitude of an amplified digital signal so as to obtain a signal strength of the transmitting channel at a required frequency point, and output the obtained signal strength of the transmitting channel to the control unit.

In an exemplary example, the required frequency point is a frequency point for determining an over-standard position, and for a second harmonic, a frequency point of the second harmonic is the required frequency point.

In an exemplary example, the coupler may share a broadband bidirectional coupler included in the transmitting channel of the mobile terminal, or the monitoring unit may use a broadband coupler alone.

In an exemplary example, a local oscillator frequency of the first down-conversion circuit may be arbitrarily selected, such as a transmission center frequency, or a double frequency of the transmission center frequency, or a triple frequency of the transmission center frequency.

In an exemplary example, the first digital processing unit is configured to:

perform a Fourier transform on a digital signal output from the first digital variable gain amplifier to obtain a corresponding relationship between a frequency and a signal amplitude; and add a gain value of the first digital variable gain amplifier and a coupling degree of the coupler to an obtained signal amplitude to obtain the signal strength at the required frequency point.

Figure 3:
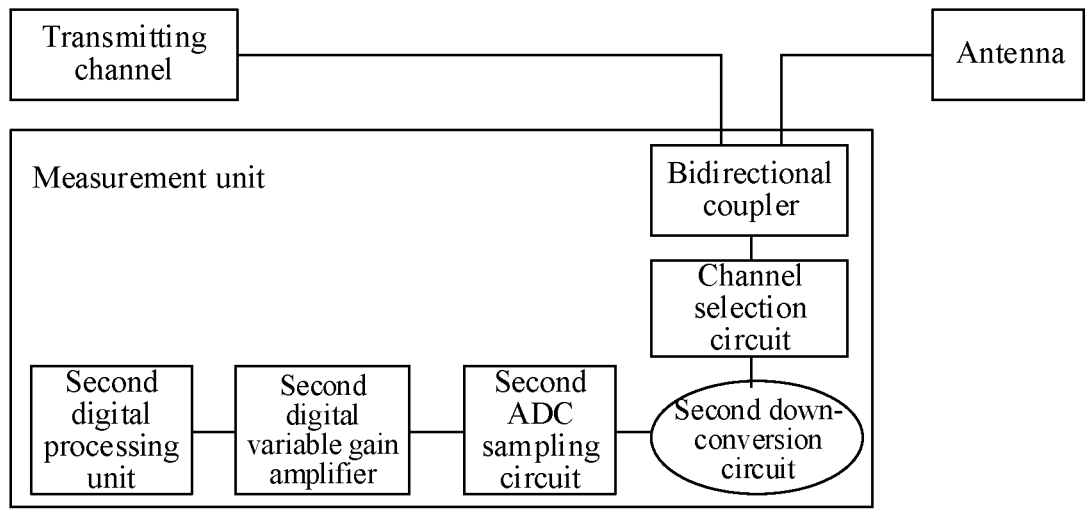
FIG. 3 is a schematic diagram illustrating a composition and structure of a measurement unit provided by an embodiment of the present disclosure.

FIG. 3 is a schematic diagram illustrating a composition and structure of a measurement unit provided by an embodiment of the present disclosure. As shown in FIG. 3, the measurement unit at least includes: a bidirectional coupler, a channel selection circuit, a second down-conversion circuit, a second ADC sampling circuit, a second digital variable gain amplifier and a second digital processing unit; where the bidirectional coupler is configured to couple a reference signal transmitted in a transmitting channel to obtain a coupled signal; and the channel selection circuit is configured to receive the coupled signal of a forward signal through a first channel and receive the coupled signal of a reflected signal through a second channel. When a VSWR measurement is required, the channel selection circuit switches the first channel and the second channel once respectively. The second down-conversion circuit is configured to process the coupled signal according to a preset frequency so as to obtain a first low-frequency signal with a required frequency; and process the reflected signal according to the preset frequency to obtain a second low-frequency signal with the required frequency, where the preset frequency is the required frequency. The second ADC sampling circuit is configured to perform an analog-to-digital conversion on the first low-frequency signal to obtain a first digital signal; and perform the analog-to-digital conversion on the second low-frequency signal to obtain a second digital signal. The second digital variable gain amplifier is configured to amplify the first digital signal, so that the amplified first digital signal is within a range that the second digital processing unit may process; and amplify the second digital signal so that the amplified second digital signal is within a range that the second digital processing unit may process. The second digital processing unit is configured to determine a current load impedance value of the power amplifier according to the obtained first digital signal and second digital signal.

In an exemplary example, the second digital processing unit is configured to: perform calculation based on the first digital signal to obtain a first signal strength and first phase information of the coupled signal, and perform calculation based on the second digital signal to obtain a second signal strength and second phase information of the coupled signal; calculate a ratio of the first signal strength to the second signal strength to obtain a voltage standing wave ratio (VSWR), and obtain phase information of an impedance according to a difference between the first phase information and the second phase information; and calculate the current load impedance value of the power amplifier according to the VSWR, the phase information of the impedance and a scattering parameter stored in a memory, and output the obtained load impedance value to the control unit.

The scattering parameter stored in the memory is real-time impedance information of a current circuit. After the adjustment unit performs matching adjustment on the corresponding circuit, the scattering parameter may be updated accordingly.

In an exemplary example, the channel selection circuit may be a double-pole double-throw switch or a similar functional circuit built by a single-pole double-throw switch.

In an exemplary example, the monitoring unit and the measurement unit are two independent functional units, but a circuit in the monitoring unit with the same functions as that in the measurement unit may be multiplexed, that is, only one set of circuits is provided in the wireless signal performance apparatus, such as the first down-conversion circuit and the second down-conversion circuit, the first ADC sampling circuit and the second ADC sampling circuit, the first digital variable gain amplifier and the second digital variable gain amplifier, etc. A set of circuits with the same function in the monitoring unit and the measuring unit may also be provided respectively.

Figure 4:
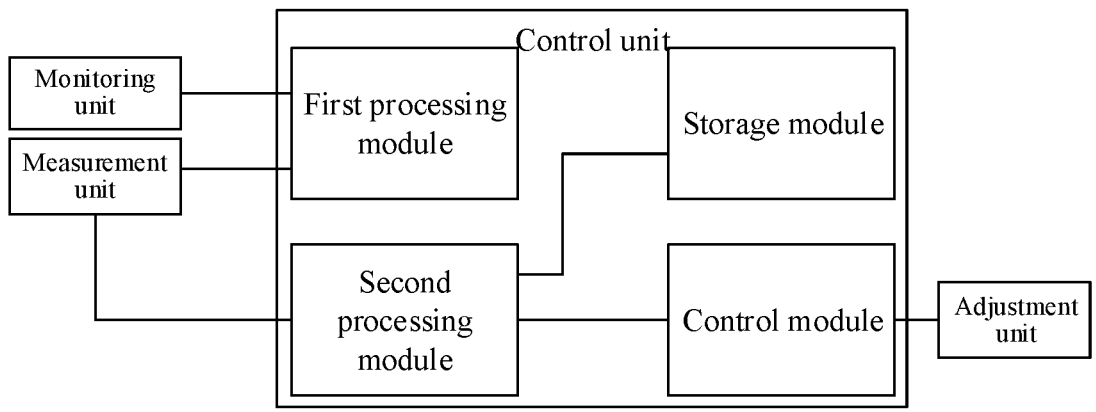
FIG. 4 is a schematic diagram illustrating a composition and structure of a control unit provided by an embodiment of the present disclosure.

FIG. 4 is a schematic diagram illustrating a composition and structure of a control unit according to an embodiment of the present disclosure. As shown in FIG. 4, the control unit at least includes a first processing module, a second processing module, a control module and a storage module storing loadpull information, where the first processing module is configured to receive a signal of the transmitting channel from the monitoring unit, and control the measurement unit to perform measurement if the radio frequency signal of the transmitting channel does not meet the performance requirement condition; the second processing module is configured to query optimal impedance position information and calculate the adjustment information according to the loadpull information of the power amplifier, based on a value of the load impedance from the measurement unit; and the control module is configured to control the adjustment unit to adjust the transmitting channel according to the obtained adjustment information, and update a scattering parameter in the memory according to an adjustment result.

In an exemplary example, the adjustment information includes the amount of tuning change in a tuning part, such as a capacitance change of an adjustable capacitor, an inductance change of an adjustable inductor, and the like.

In an exemplary example, a method of calculating the adjustment information is related to the number of devices with adjustable impedance in the matching circuit. If the adjustment is successfully completed, that is, if it is determined that the radio frequency signal of the transmitting channel meets the performance requirement condition, the final numerical information of adjustable devices may be updated to the memory for convenience of future debugging and use. In an exemplary example, the method of calculating the adjustment information may include: an adjustment of a parallel circuit may be performed according to an addition and subtraction of an admittance, and an adjustment of a series circuit may be performed according to an addition and subtraction of an impedance.

Figure 5:
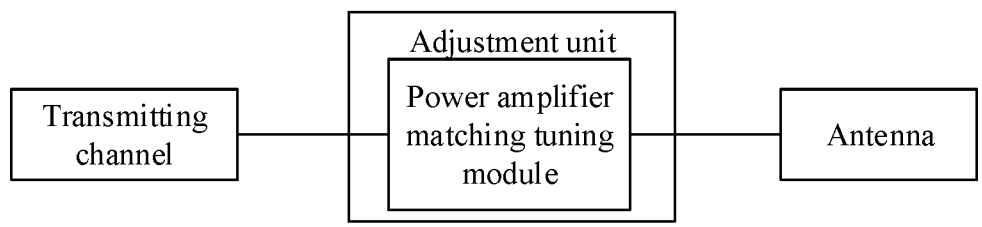
FIG. 5 is a schematic diagram illustrating a composition and structure of an adjustment unit according to an embodiment of the present disclosure.

FIG. 5 is schematic diagram illustrating a composition and structure of an adjustment unit according to an embodiment of the present disclosure. As shown in FIG. 5, the adjustment unit includes a power amplifier matching tuning module configured to:

adjust a transmitting channel according to the obtained adjustment information under the control of a control unit, and tune a load impedance of a power amplifier to match with a current antenna to adapt to a position to achieve the best RxBN and harmonic, so that the radio frequency signal of the transmitting channel meets a performance requirement condition.

In an exemplary example, the power amplifier matching tuning module may realize tuning by using a variable inductance or a variable capacitance, and may also use a switch to perform different matching selections to achieve the function of tuning.

In an exemplary example, the adjustment information includes the amount of tuning change in a tuning part, such as a capacitance change of an adjustable capacitor, an inductance change of an adjustable inductor, and the like.

Figure 6:
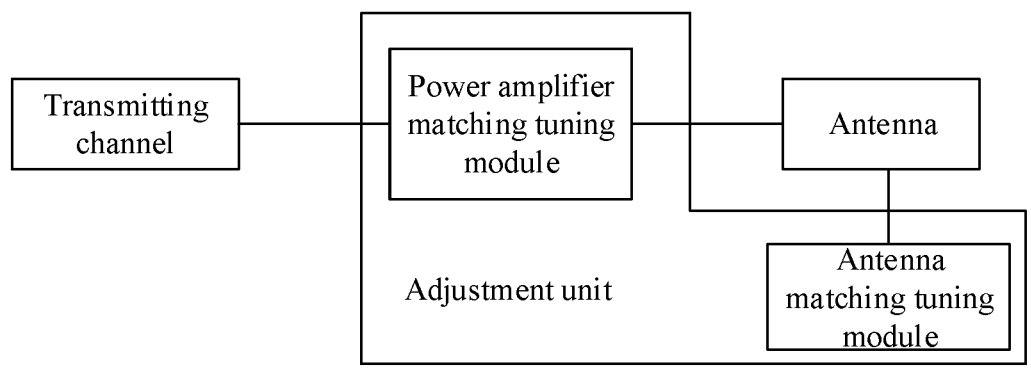
FIG. 6 is a schematic diagram illustrating a composition and structure of another adjustment unit according to an embodiment of the present disclosure.

FIG. 6 is a schematic diagram illustrating a composition and structure of another adjustment unit according to an embodiment of the present disclosure. As shown in FIG. 6, the adjustment unit includes a power amplifier matching tuning module and an antenna matching tuning module.

In this embodiment, when the adjustment of the power amplifier matching tuning module fails to achieve the purpose, that is, when the radio frequency signal of the transmitting channel still does not meet the performance requirement condition, the antenna matching tuning module is activated for adjustment. The antenna matching tuning module is configured to adjust impedance matching between the transmitting channel and an antenna according to impedance position information stored in a memory, so that the radio frequency signal of the transmitting channel meets the performance requirement condition. The power amplifier matching tuning module is the same as that in the previous embodiment, which is not repeated here.

Figure 7:
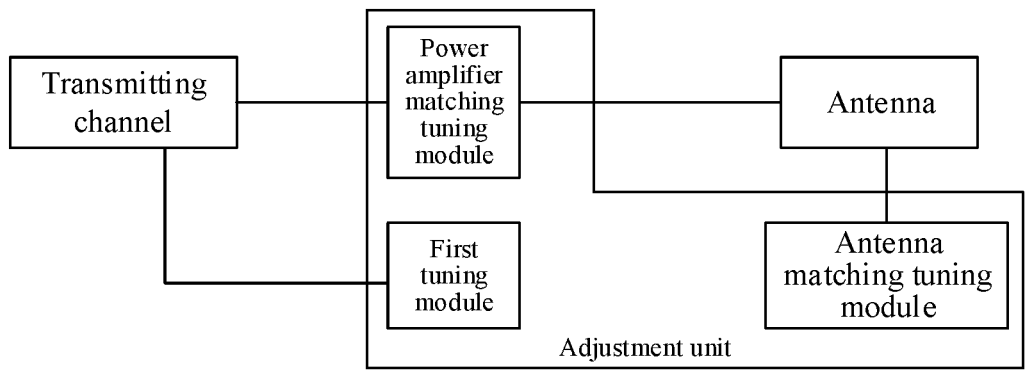
FIG. 7 is a schematic diagram illustrating a composition and structure of yet another adjustment unit according to an embodiment of the present disclosure.

FIG. 7 is a schematic diagram illustrating a composition and structure of another adjustment unit according to an embodiment of the present disclosure. As shown in FIG. 7, the adjustment unit includes a power amplifier matching tuning module, an antenna matching tuning module and a first tuning module.

In this embodiment, when the adjustment of the antenna matching tuning circuit fails to achieve the purpose, that is, when the radio frequency signal of the transmitting channel still does not meet the performance requirement condition, the first tuning module is activated for adjustment by adjusting a peak-to-average ratio of the transmitted signal The first tuning module is configured to adjust the peak-to-average ratio of the transmitted signal in the transmitting channel, so that the radio frequency signal of the transmitting channel meets the performance requirement condition. The power amplifier matching tuning module and the antenna matching tuning module are the same as those in the previous embodiment, which are not repeated here.

In an exemplary example, the function of the first tuning module belongs to a modem, which may be set in a control unit.

Figure 8:
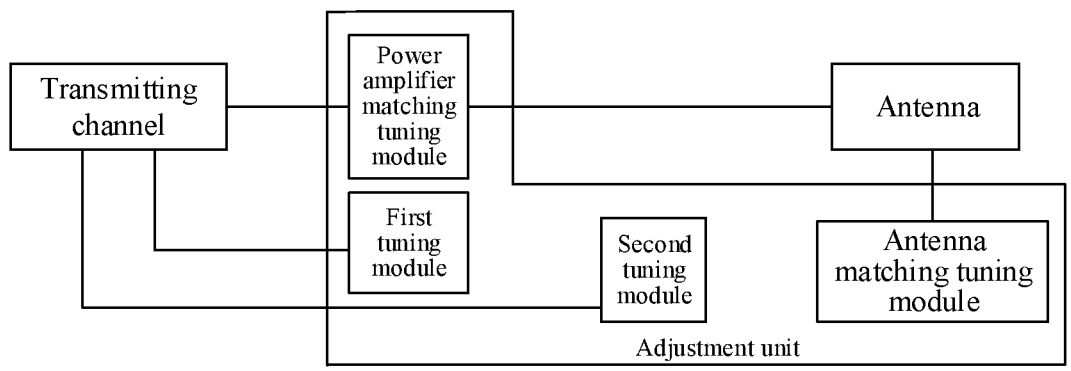
FIG. 8 is a schematic diagram illustrating a composition and structure of yet another adjustment unit according to a fourth embodiment of the present disclosure.

FIG. 8 is a schematic diagram illustrating a composition and structure of another adjustment unit according to an embodiment of the present disclosure. As shown in FIG. 8, the adjustment unit includes a power amplifier matching tuning module, an antenna matching tuning module, a first tuning module and a second tuning module.

The second tuning module is configured to adjust a transmitting power so that the radio frequency signal of the transmitting channel meets the performance requirement condition.

In this embodiment, when the adjustment of the peak-to-average ratio of the transmitted signal fails to achieve the purpose, that is, when the radio frequency signal of the transmitting channel still does not meet the performance requirement condition, the second tuning module is activated for adjustment by adjusting the transmitting power and gradually reduce the transmitting power.

In an exemplary example, the function of the first tuning module and the second tuning module belongs to a modem, which may be set in a control unit.

The present disclosure further provides a wireless communication terminal, which includes the wireless signal performance adjustment apparatus according to any embodiment of the present disclosure.

Figure 9:
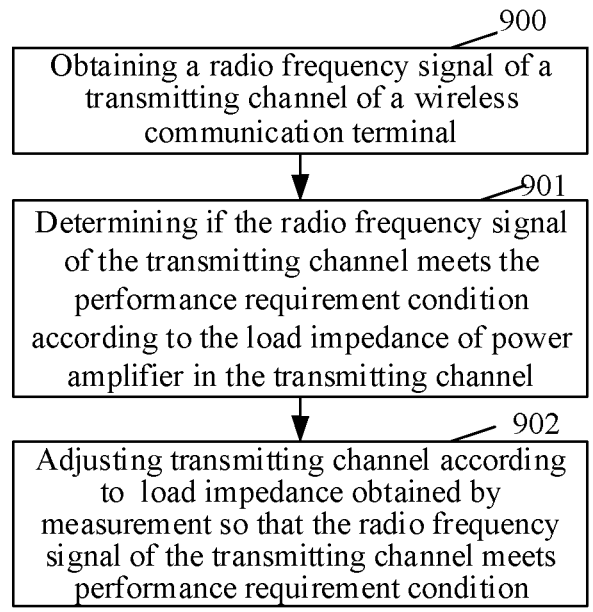
FIG. 9 is a schematic flow chart illustrating a wireless signal performance adjustment method according to an embodiment of the present disclosure.

FIG. 9 is a schematic flow chart illustrating a wireless signal performance adjustment method according to an embodiment of the present disclosure. As shown in FIG. 9, the method includes:

Step 900: obtaining a radio frequency signal of a transmitting channel of a wireless communication terminal.

In an exemplary example, the radio frequency signal of the transmitting channel may be obtained by monitoring the transmitting channel of the wireless communication terminal in real time. The radio frequency signal of the transmitting channel may also be obtained by monitoring the transmitting channel of the wireless communication terminal according to a preset period or within a specified time period.

Step 901: determining that the radio frequency signal of the transmitting channel does not meet a performance requirement condition according to the obtained radio frequency signal of the transmitting channel, and measuring a load impedance of a power amplifier in the transmitting channel.

In an exemplary example, not meeting the performance requirement condition includes not meeting an electromagnetic compatibility performance requirement.

In an exemplary example, determining that the radio frequency signal of the transmitting channel does not meet the performance requirement condition according to the obtained radio frequency signal of the transmitting channel may include:

monitoring, according to a frequency point of a spurious signal, a signal strength at the frequency point of the transmitting channel. When the obtained signal strength exceeds a certain threshold, it is determined that the radio frequency signal of the transmitting channel does not meet the performance requirement condition, which means that there is an electromagnetic compatibility risk in the wireless communication terminal.

The frequency point of the spurious signal is also the position of the spurious signal. According to the EMC specification, there are different EMC requirements for different frequency points. Therefore, according to the present disclosure, during monitoring, it is necessary to determine the measured frequency point first, and then measure this position.

In an exemplary example, if it is determined that the radio frequency signal of the transmitting channel meets the performance requirement condition, then the step of determining the obtained radio frequency signal of the transmitting channel of the wireless communication terminal is continued to proceed.

In an exemplary example, measuring the load impedance of the power amplifier in the transmitting channel may include:

coupling a reference signal transmitted in the transmitting channel; processing the coupled signal obtained by coupling according to a preset frequency so as to obtain a first digital signal, and processing a reflected signal emitted by the coupled signal according to the preset frequency to obtain a second digital signal; and determining a value of the load impedance of the power amplifier according to the obtained first digital signal and the obtained second digital signal.

In an exemplary example, the processing of the coupled signal obtained by coupling or the reflected signal includes: performing a down-conversion processing, an analog-to-digital conversion and an amplification processing.

In an exemplary example, determining the current load impedance value of the power amplifier according to the obtained first digital signal and second digital signal includes:

performing calculation based on the first digital signal to obtain a first signal strength and first phase information of the coupled signal, and performing calculation based on the second digital signal to obtain a second signal strength and second phase information of the coupled signal (where before performing calculation based on the first digital signal or the second digital signal, the method may further include amplifying the first digital signal and amplifying the second digital signal); calculating a ratio of the first signal strength to the second signal strength to obtain a voltage standing wave ratio (VSWR), and obtaining phase information of an impedance according to a difference between the first phase information and the second phase information; and calculating the current value of the load impedance of the power amplifier according to the VSWR, the phase information of the impedance and a scattering parameter stored in a memory.

The scattering parameter stored in the memory is real-time impedance information of the current circuit. After the adjustment unit performs matching adjustment on the corresponding circuit, the scattering parameter may be updated accordingly.

Step 902: adjusting the transmitting channel according to the load impedance obtained by the measurement so that the radio frequency signal of the transmitting channel meets the performance requirement condition.

In an exemplary example, the step 902 may include:

querying optimal impedance position information and calculating adjustment information according to loadpull information of the power amplifier based on a value of the load impedance obtained by the measurement; and adjusting the transmitting channel according to the obtained adjustment information, and updating a scattering parameter in a memory according to an adjustment result.

In an exemplary example, the adjustment information includes the amount of tuning change in a tuning part, such as a capacitance change of an adjustable capacitor, an inductance change of an adjustable inductor, and the like.

In an exemplary example, a method of calculating the adjustment information is related to the number of devices with adjustable impedance in the matching circuit. If the adjustment is successfully completed, that is, if it is determined that the radio frequency signal of the transmitting channel meets the performance requirement condition, the final numerical information of adjustable devices may be updated to the memory for convenience of future debugging and use. In an exemplary example, the method of calculating the adjustment information may include: an adjustment of a parallel circuit may be performed according to an addition and subtraction of an admittance, and an adjustment of a series circuit may be performed according to an addition and subtraction of an impedance.

In an exemplary example, adjusting the transmitting channel according to the adjustment information may include at least one of:

adjusting matching of the power amplifier in the transmitting channel according to the adjustment information; adjusting impedance matching between the transmitting channel and an antenna according to the adjustment information; adjusting a peak-to-average ratio of a transmitted signal in the transmitting channel according to the adjustment information; and adjusting a transmitting power according to the adjustment information.

Figure 10:
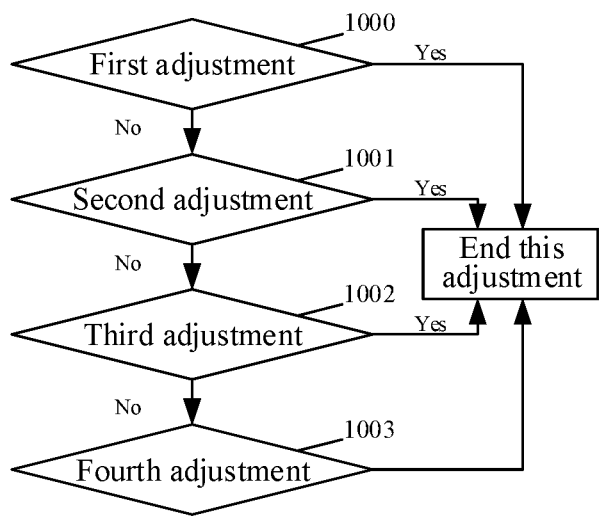
FIG. 10 is a schematic flow chart illustrating a flow for adjusting a transmitting channel according to an embodiment of the present disclosure.

In an exemplary example, adjusting the transmitting channel according to the adjustment information so that the radio frequency signal of the transmitting channel to meet the performance requirement condition includes:

adjusting matching of the power amplifier in the transmitting channel according to the adjustment information, so as to enable the radio frequency signal of the transmitting channel to meet the performance requirement condition; or, adjusting matching of the power amplifier in the transmitting channel according to the adjustment information, and adjusting, if the radio frequency signal of the transmitting channel does not meet the performance requirement condition after adjusting the matching of the power amplifier in the transmitting channel, impedance matching between the transmitting channel and an antenna according to adjustment information obtained based on the calculated value of the load impedance obtained by one more measurement, so that the radio frequency signal of the transmitting channel meets the performance requirement condition; or adjusting the matching of the power amplifier in the transmitting channel according to the adjustment information; adjusting, if the radio frequency signal of the transmitting channel does not meet the performance requirement condition after adjusting the matching of the power amplifier in the transmitting channel, the impedance matching between the transmitting channel and the antenna according to the adjustment information obtained based on calculation of the calculated value of the load impedance obtained by the one more measurement; and adjusting, if the radio frequency signal of the transmitting channel does not meet the performance requirement condition after adjusting the impedance matching between the transmitting channel and the antenna, a peak-to-average ratio of a transmitted signal in the transmitting channel according to adjustment information obtained by calculating a load impedance value obtained by another measurement, so that the radio frequency signal of the transmitting channel meets the performance requirement condition; or, as shown in FIG. 10, adjusting the transmitting channel according to the adjustment information so that the radio frequency signal of the transmitting channel to meet the performance requirement condition includes following steps.

At step 1000 which is for the first adjustment, adjusting the matching of the power amplifier in the transmitting channel according to the adjustment information. If the radio frequency signal of the transmitting channel still does not meet the performance requirement condition, go to step 1001; and if the performance requirement condition is met, this adjustment is ended.

At step 1001 which is for the second adjustment, adjusting the impedance matching between the transmitting channel and the antenna according to the adjustment information calculated based on the value of the load impedance obtained by the one more measurement. If the radio frequency signal of the transmitting channel still does not meet the performance requirement condition, go to step 1002; and if the performance requirement condition is met, this adjustment is ended.

At step 1002 which is for the third adjustment, adjusting the peak-to-average ratio of the transmitted signal in the transmitting channel according to the adjustment information calculated based on the value of the load impedance obtained by the another measurement. If the radio frequency signal of the transmitting channel still does not meet the performance requirement condition, go to step 1003; and if the performance requirement condition is met, end this adjustment.

At step 1003 which is for the fourth adjustment, adjusting a transmitting power according to adjustment information calculated based on the value of the load impedance obtained by yet another measurement, so that the radio frequency signal of the transmitting channel meets the performance requirement condition.

The present disclosure detects an abnormal state by monitoring a transmission indicator of the transmitting channel in real time, and realizes adjustment of the transmission performance of the transmitting channel by adjusting the power amplifier, so as to reduce electromagnetic interference signals radiated by the wireless communication terminal, thereby improving the electromagnetic compatibility performance of the wireless communication terminal, and thus meeting the electromagnetic compatibility performance requirement of the wireless communication terminal in a complex and changeable actual use scenario.

What is claimed is:

1. A wireless signal performance adjustment apparatus, comprising: a monitoring unit, a control unit, a measurement unit and an adjustment unit; wherein:
   the monitoring unit is configured to monitor a radio frequency signal of a transmitting channel;
   the control unit is configured to receive the radio frequency signal of the transmitting channel from the monitoring unit, control the measurement unit to perform measurement if the radio frequency signal of the transmitting channel does not meet a performance requirement condition, and determine adjustment information according to a load impedance from the measurement unit;
   the measurement unit is configured to measure a load impedance of a power amplifier in the transmitting channel under control of the control unit; and
   the adjustment unit is configured to adjust the transmitting channel according to the adjustment information under the control of the control unit, so that the radio frequency signal of the transmitting channel meets the performance requirement condition,
   wherein the monitoring unit comprises a coupler, a first down-conversion circuit, a first analog-to-digital converter ADC sampling circuit, a first digital variable gain amplifier and a first digital processing unit;
   the coupler is configured to obtain the radio frequency signal by coupling from the transmitting channel and output the radio frequency signal to the first down-conversion circuit;
   the first down-conversion circuit is configured to process the radio frequency signal obtained by coupling according to a preset frequency so as to obtain a low-frequency signal at a required frequency point;
   the first ADC sampling circuit is configured to perform analog-to-digital conversion on the low-frequency signal to obtain a digital signal;
   the first digital variable gain amplifier is configured to amplify the digital signal obtained by the analog-to-digital conversion; and
   the first digital processing unit is configured to calculate an amplitude of the amplified digital signal to obtain a signal strength of the transmitting channel at the required frequency point, and output the obtained signal strength of the transmitting channel at the required frequency point to the control unit,
   wherein the first digital processing unit is configured to as the following for obtaining the signal strength of the transmitting channel at the required frequency point: perform Fourier transform on a digital signal output from the first digital variable gain amplifier to obtain a corresponding relationship between a frequency and a signal amplitude, and add a gain value of the first digital variable gain amplifier and a coupling degree of the coupler to a signal amplitude obtained so as to obtain the signal strength of the transmitting channel at the required frequency point.

2. The apparatus according to claim 1, wherein the adjustment unit comprises at least one of the following modules:
   a power amplifier matching and tuning module configured to adjust matching of the power amplifier in the transmitting channel, so that the radio frequency signal of the transmitting channel meets the performance requirement condition;

an antenna matching and tuning module configured to adjust impedance matching between the transmitting channel and an antenna, so that the radio frequency signal of the transmitting channel meets the performance requirement condition;

a first tuning module configured to adjust a peak-to-average ratio of a transmitted signal in the transmitting channel, so that the radio frequency signal of the transmitting channel meets the performance requirement condition; and a second tuning module configured to adjust a transmitting power so that the radio frequency signal of the transmitting channel meets the performance requirement condition.

3. The apparatus according to claim 1, wherein the monitoring unit is configured to:

monitor a transmitting channel of a wireless communication terminal in real time to obtain the radio frequency signal of the transmitting channel; or monitor the transmitting channel of the wireless communication terminal according to a preset period or within a specified time period to obtain the radio frequency signal of the transmitting channel.

4. The apparatus according to claim 1, wherein the measurement unit comprises a bidirectional coupler, a channel selection circuit, a second down-conversion circuit, a second ADC sampling circuit, a second digital variable gain amplifier and a second digital processing unit; wherein, the bidirectional coupler is configured to couple a reference signal transmitted by the transmitting channel to obtain a coupled signal;

the channel selection circuit is configured to receive the coupled signal through a first channel and receive a reflected signal reflected by the coupled signal through a second channel;

the second down-conversion circuit is configured to process the coupled signal received by the channel selection circuit according to a preset frequency so as to obtain a first low-frequency signal with a required frequency; and process the reflected signal received by the channel selection circuit according to the preset frequency to obtain a second low-frequency signal with the required frequency;

the second ADC sampling circuit is configured to perform an analog-to-digital conversion on the first low-frequency signal to obtain a first digital signal; and perform an analog-to-digital conversion on the second low-frequency signal to obtain a second digital signal;

the second digital variable gain amplifier is configured to amplify the first digital signal and amplify the second digital signal; and the second digital processing unit is configured to determine a value of the load impedance of the power amplifier according to the amplified first digital signal and the amplified second digital signal, and output the value of load impedance to the control unit.

5. The wireless signal performance adjustment apparatus according to claim 4, wherein the second digital processing unit is configured to:

perform calculation based on the first digital signal to obtain a first signal strength and first phase information of the coupled signal, and perform calculation based on the second digital signal to obtain a second signal strength and second phase information of the coupled signal; calculate a ratio of the first signal strength to the second signal strength to obtain a voltage standing wave ratio VSWR, and obtain phase information of an impedance according to a difference between the first phase information and the second phase information; and obtained the value of the load impedance of the power amplifier by calculation according to the VSWR, the phase information of the impedance and a scattering parameter stored in a memory, and output the obtained load impedance value to the control unit.

6. The apparatus according to claim 1, wherein the control unit comprises a first processing module, a second processing module, a control module, and a storage module storing loadpull information of the power amplifier; wherein, the first processing module is configured to receive a signal of the transmitting channel from the monitoring unit, and control the measurement unit to perform measurement if the radio frequency signal of the transmitting channel does not meet the performance requirement condition;

the second processing module is configured to query optimal impedance position information and calculate the adjustment information according to the loadpull information of the power amplifier, based on a value of the load impedance from the measurement unit; and the control module is configured to control the adjustment unit to adjust the transmitting channel according to obtained adjustment information, and update a scattering parameter in the memory according to an adjustment result.

7. A wireless communication terminal comprising a wireless signal performance adjustment apparatus, wherein the wireless signal performance adjustment apparatus comprises a monitoring unit, a control unit, a measurement unit and an adjustment unit; wherein, the monitoring unit is configured to monitor a radio frequency signal of a transmitting channel;

the control unit is configured to receive the radio frequency signal from the transmitting channel of the monitoring unit, control the measurement unit to perform measurement if the radio frequency signal of the transmitting channel does not meet a performance requirement condition, and determine adjustment information according to a load impedance from the measurement unit;

the measurement unit is configured to measure a load impedance of a power amplifier in the transmitting channel under control of the control unit; and the adjustment unit is configured to adjust the transmitting channel according to the adjustment information under the control of the control unit, so that the radio frequency signal of the transmitting channel meets the performance requirement condition, wherein the monitoring unit comprises a coupler, a first down-conversion circuit, a first analog-to-digital converter ADC sampling circuit, a first digital variable gain amplifier and a first digital processing unit;

the coupler is configured to obtain the radio frequency signal by coupling from the transmitting channel and output the radio frequency signal to the first down-conversion circuit;

the first down-conversion circuit is configured to process the radio frequency signal obtained by coupling according to a preset frequency so as to obtain a low-frequency signal at a required frequency point;

the first ADC sampling circuit is configured to perform analog-to-digital conversion on the low-frequency signal to obtain a digital signal;

the first digital variable gain amplifier is configured to amplify the digital signal obtained by the analog-to-digital conversion; and the first digital processing unit is configured to calculate an amplitude of the amplified digital signal to obtain a signal strength of the transmitting channel at the required frequency point, and output the obtained signal strength of the transmitting channel at the required frequency point to the control unit, wherein the first digital processing unit is configured to as the following for obtaining the signal strength of the transmitting channel at the required frequency point: perform Fourier transform on a digital signal output from the first digital variable gain amplifier to obtain a corresponding relationship between a frequency and a signal amplitude, and add a gain value of the first digital variable gain amplifier and a coupling degree of the coupler to a signal amplitude obtained so as to obtain the signal strength of the transmitting channel at the required frequency point.

8. A wireless communication terminal according to claim 7, wherein the adjustment unit comprises at least one of the following modules:

a power amplifier matching and tuning module configured to adjust matching of the power amplifier in the transmitting channel, so that the radio frequency signal of the transmitting channel meets the performance requirement condition;

an antenna matching and tuning module configured to adjust impedance matching between the transmitting channel and an antenna, so that the radio frequency signal of the transmitting channel meets the performance requirement condition;

a first tuning module configured to adjust a peak-to-average ratio of a transmitted signal in the transmitting channel, so that the radio frequency signal of the transmitting channel meets the performance requirement condition; and a second tuning module configured to adjust a transmitting power so that the radio frequency signal of the transmitting channel meets the performance requirement condition.

9. A wireless signal performance adjustment method, comprising:

obtaining a radio frequency signal of a transmitting channel of a wireless communication terminal;

measuring a load impedance of a power amplifier in the transmitting channel, upon determining, according to the obtained radio frequency signal of the transmitting channel, that the radio frequency signal of the transmitting channel does not meet a performance requirement condition; and adjusting the transmitting channel according to the measured load impedance so that the radio frequency signal of the transmitting channel meets the performance requirement condition, wherein determining, according to the radio frequency signal of the transmitting channel, that the radio frequency signal of the transmitting channel does not meet the performance requirement condition comprises:

monitoring and obtaining a signal strength of the radio frequency signal of the transmitting channel according to a position of a spurious signal in the radio frequency signal of the transmitting channel, and determining that the radio frequency signal of the transmitting channel does not meet the performance requirement condition when the obtained signal strength exceeds a standard, wherein obtaining the signal strength of the radio frequency signal of the transmitting channel comprises:

obtaining, by a coupler, the radio frequency signal by coupling from the transmitting channel;

processing the radio frequency signal obtained according to a preset frequency so as to obtain a low-frequency signal at a required frequency point;

performing analog-to-digital conversion on the low-frequency signal to obtain a digital signal;

amplifying, by a first digital variable gain amplifier, the digital signal obtained by the analog-to-digital conversion; and performing Fourier transform on the digital signal amplified to obtain a corresponding relationship between a frequency and a signal amplitude, and adding a gain value of the first digital variable gain amplifier and a coupling degree of the coupler to a signal amplitude obtained so as to obtain the signal strength of the transmitting channel at the required frequency point.

10. The method according to claim 9, further comprising:

continuing to make determination on obtained radio frequency signal of the transmitting channel of the wireless communication terminal when the radio frequency signal of the transmitting channel is determined to meet the performance requirement condition.

11. The method according to claim 9, wherein obtaining the radio frequency signal of the transmitting channel of the wireless communication terminal comprises:

obtaining the radio frequency signal of the transmitting channel by monitoring the transmitting channel of the wireless communication terminal in real time; or obtaining the radio frequency signal of the transmitting channel by monitoring the transmitting channel of the wireless communication terminal according to a preset period or within a specified time period.

12. The method according to claim 9, wherein measuring the load impedance of the power amplifier in the transmitting channel comprises:

coupling a reference signal transmitted in the transmitting channel to obtain a coupled signal;

processing the coupled signal obtained by coupling according to a preset frequency so as to obtain a first digital signal, and processing a reflected signal reflected by the coupled signal according to the preset frequency to obtain a second digital signal; and determining a value of the load impedance of the power amplifier according to the obtained first digital signal and the obtained second digital signal.

13. The method according to claim 12, wherein determining the value of the load impedance of the power amplifier according to the obtained first digital signal and the obtained second digital signal comprises:

perform calculation based on the first digital signal to obtain a first signal strength and first phase information of the coupled signal, and perform calculation based on the second digital signal to obtain a second signal strength and second phase information of the coupled signal;

calculating a ratio of the first signal strength to the second signal strength to obtain a voltage standing wave ratio VSWR, and obtaining phase information of an impedance according to a difference between the first phase information and the second phase information; and calculating the value of the load impedance of the power amplifier according to the VSWR, the phase information of the impedance and a scattering parameter stored in a memory.

14. The method according to claim 12, wherein the processing of the coupled signal obtained by coupling or the reflected signal comprises: performing a down-conversion processing, an analog-to-digital conversion and an amplification.

15. The method according to claim 9, wherein adjusting the transmitting channel according to the load impedance obtained by the measurement comprises:
   querying optimal impedance position information and calculating adjustment information according to load-pull information of the power amplifier based on a value of the load impedance obtained by the measurement; and
   adjusting the transmitting channel according to the obtained adjustment information, and updating a scattering parameter in a memory according to an adjustment result.

16. The method according to claim 15, wherein adjusting the transmitting channel according to the adjustment information comprises at least one of the following:
   adjusting matching of the power amplifier in the transmitting channel according to the adjustment information;
   adjusting impedance matching between the transmitting channel and an antenna according to the adjustment information;
   adjusting a peak-to-average ratio of a transmitted signal in the transmitting channel according to the adjustment information; and
   adjusting a transmitting power according to the adjustment information.

17. The method according to claim 15, wherein adjusting the transmitting channel according to the adjustment information comprises one of the following:
   adjusting matching of the power amplifier in the transmitting channel according to the adjustment information, so that the radio frequency signal of the transmitting channel meets the performance requirement condition;
   adjusting matching of the power amplifier in the transmitting channel according to the adjustment information, and adjusting, if the radio frequency signal of the transmitting channel does not meet the performance requirement condition after adjusting the matching of the power amplifier in the transmitting channel, impedance matching between the transmitting channel and an antenna according to the adjustment information calculated based on the value of the load impedance obtained by one more measurement, so that the radio frequency signal of the transmitting channel meets the performance requirement condition;
   adjusting the matching of the power amplifier in the transmitting channel according to the adjustment information; adjusting, if the radio frequency signal of the transmitting channel does not meet the performance requirement condition after adjusting the matching of the power amplifier in the transmitting channel, the impedance matching between the transmitting channel and the antenna according to the adjustment information calculated based on the value of the load impedance obtained by the one more measurement; and adjusting, if the radio frequency signal of the transmitting channel does not meet the performance requirement condition after adjusting the impedance matching between the transmitting channel and the antenna, a peak-to-average ratio of a transmitted signal in the transmitting channel according to the adjustment information calculated based on the value of the load impedance obtained by another measurement, so that the radio frequency signal of the transmitting channel meets the performance requirement condition; and
   adjusting the matching of the power amplifier in the transmitting channel according to the adjustment information; adjusting, if the radio frequency signal of the transmitting channel does not meet the performance requirement condition after adjusting the matching of the power amplifier in the transmitting channel, the impedance matching between the transmitting channel and the antenna according to the adjustment information calculated based on the value of the load impedance obtained by the one more measurement; adjusting, if the radio frequency signal of the transmitting channel does not meet the performance requirement condition after adjusting the impedance matching between the transmitting channel and the antenna, the peak-to-average ratio of the transmitted signal in the transmitting channel according to the adjustment information calculated based on the value of the load impedance obtained by another measurement; and adjusting, if the radio frequency signal of the transmitting channel does not meet the performance requirement condition after adjusting the peak-to-average ratio of the transmitted signal in the transmitting channel, a transmitting power according to adjustment information calculated based on the value of the load impedance obtained by yet another measurement, so that the radio frequency signal of the transmitting channel meets the performance requirement condition.

* * * * *